(12) United States Patent
Park et al.

(10) Patent No.: US 11,017,989 B2
(45) Date of Patent: May 25, 2021

(54) COLLIMATOR, FABRICATION APPARATUS INCLUDING THE SAME, AND METHOD OF FABRICATING A SEMICONDUCTOR DEVICE USING THE SAME

(71) Applicant: Samsung Electronics Co., Ltd., Suwon-si (KR)

(72) Inventors: Jiho Park, Suwon-si (KR); Jeonghee Park, Hwaseong-si (KR); Changyup Park, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 343 days.

(21) Appl. No.: 16/127,452

(22) Filed: Sep. 11, 2018

(65) Prior Publication Data
US 2019/0287771 A1    Sep. 19, 2019

(30) Foreign Application Priority Data

Mar. 16, 2018  (KR) .................. 10-2018-0030687
Mar. 30, 2018  (KR) .................. 10-2018-0037432

(51) Int. Cl.
| H01J 37/34 | (2006.01) |
| H01J 37/32 | (2006.01) |
| H01L 27/24 | (2006.01) |
| H01L 45/00 | (2006.01) |

(52) U.S. Cl.
CPC .... *H01J 37/3447* (2013.01); *H01J 37/32082* (2013.01); *H01J 37/32568* (2013.01); *H01J 37/32651* (2013.01); *H01J 37/32724* (2013.01); *H01L 27/2409* (2013.01); *H01L 45/065* (2013.01); *H01L 45/1233* (2013.01); *H01L 45/1253* (2013.01); *H01L 45/144* (2013.01); *H01L 45/1625* (2013.01); *H01L 45/1683* (2013.01); *H01J 2237/0453* (2013.01); *H01J 2237/2001* (2013.01); *H01J 2237/3323* (2013.01)

(58) Field of Classification Search
None
See application file for complete search history.

(56) References Cited

U.S. PATENT DOCUMENTS

| 5,330,628 A | * | 7/1994 | Demaray | ............... | C23C 14/046 204/192.12 |
| 5,650,052 A | * | 7/1997 | Edelstein | ................ | C23C 14/34 204/192.12 |
| 6,036,821 A | | 3/2000 | Warren | | |

(Continued)

FOREIGN PATENT DOCUMENTS

EP    0606745 B1    9/1998

*Primary Examiner* — Jason Berman
(74) *Attorney, Agent, or Firm* — Muir Patent Law, PLLC

(57) ABSTRACT

Disclosed are a collimator, a fabrication apparatus including the same, and a method of fabricating a semiconductor device using the same. The fabrication apparatus may include a chamber, a heater chuck provided in a lower region of the chamber and configured to heat a substrate, a target provided over the heater chuck, the target containing a source for a thin layer to be deposited on the substrate, a plasma electrode provided in an upper region of the chamber and configured to generate plasma near the target and thereby to produce particles from the source, and a collimator provided between the heater chuck and the target.

10 Claims, 14 Drawing Sheets

(56) References Cited

U.S. PATENT DOCUMENTS

| | | |
|---|---|---|
| 6,362,097 B1 | 3/2002 | Demaray et al. |
| 6,436,246 B1 | 8/2002 | Sandhu |
| 6,592,728 B1 | 7/2003 | Paranjpe et al. |
| 9,543,126 B2 | 1/2017 | Riker |
| 2006/0249369 A1 | 11/2006 | Marangon et al. |
| 2006/0249724 A1 | 11/2006 | Krusin-Elbaum et al. |
| 2009/0308732 A1 | 12/2009 | Cao et al. |

\* cited by examiner

US 11,017,989 B2

COLLIMATOR, FABRICATION APPARATUS INCLUDING THE SAME, AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application Nos. 10-2018-0030687 filed on Mar. 16, 2018, and 10-2018-0037432 filed on Mar. 30, 2018, in the Korean Intellectual Property Office, the entire contents of each of which are hereby incorporated by reference.

BACKGROUND OF THE INVENTION

The present disclosure relates to an apparatus for and a method of fabricating a semiconductor device, and in particular, to a collimator, a fabrication apparatus including the same, and a method of fabricating a semiconductor device using the same.

In general, a semiconductor device may be fabricated by a plurality of unit processes. The unit processes may include a deposition process, a lithography process, and an etching process. The deposition process and the etching process may be performed using plasma. The plasma is used to thermally treat a substrate.

SUMMARY

Some embodiments of the inventive concept provide a collimator, which is configured to improve thickness uniformity of a thin layer, an apparatus including the collimator, and a method of fabricating a semiconductor device using the apparatus.

An apparatus for fabricating a semiconductor device may include a chamber, a heater chuck provided in a lower region of the chamber and configured to heat a substrate, a target provided over the heater chuck, the target containing a source for a thin layer to be deposited on the substrate, a plasma electrode provided in an upper region of the chamber and configured to generate plasma near the target and thereby to produce particles from the source, and a collimator provided between the heater chuck and the target. The collimator may include a plate having a plurality of holes. The holes are formed in the plate to allow the particles to pass therethrough toward a top surface of the heater chuck. An area ratio of each of the holes increases in an outward direction parallel to the top surface of the heater chuck from a center of the plate toward an edge of the plate.

According to some embodiments of the inventive concept, a semiconductor device fabrication collimator may include a plate having a plurality of holes. The holes are formed in the plate and have an area ratio increasing in an outward direction from a center of the plate toward an edge of the plate. Each hole includes an inner side surface having a first area and a top opening having a second area. The area ratio is defined as a ratio of the first area of the inner side surface of each of the holes to the second area of the top opening of each of the holes.

According to some embodiments of the inventive concept, a method of fabricating a semiconductor device may include forming a mold layer on a substrate, partially removing the mold layer to form a contact hole exposing a portion of the substrate, and depositing a thin layer to fill the contact holes using a physical vapor deposition method. The physical vapor deposition method may be performed using a collimator, in which a plate having a plurality of holes is provided. Here, the plate may be placed to be parallel to the substrate, and the holes may be formed in the plate and may have an area ratio increasing in an outward direction parallel to a top surface of the substrate from a center of the plate toward an edge of the plate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
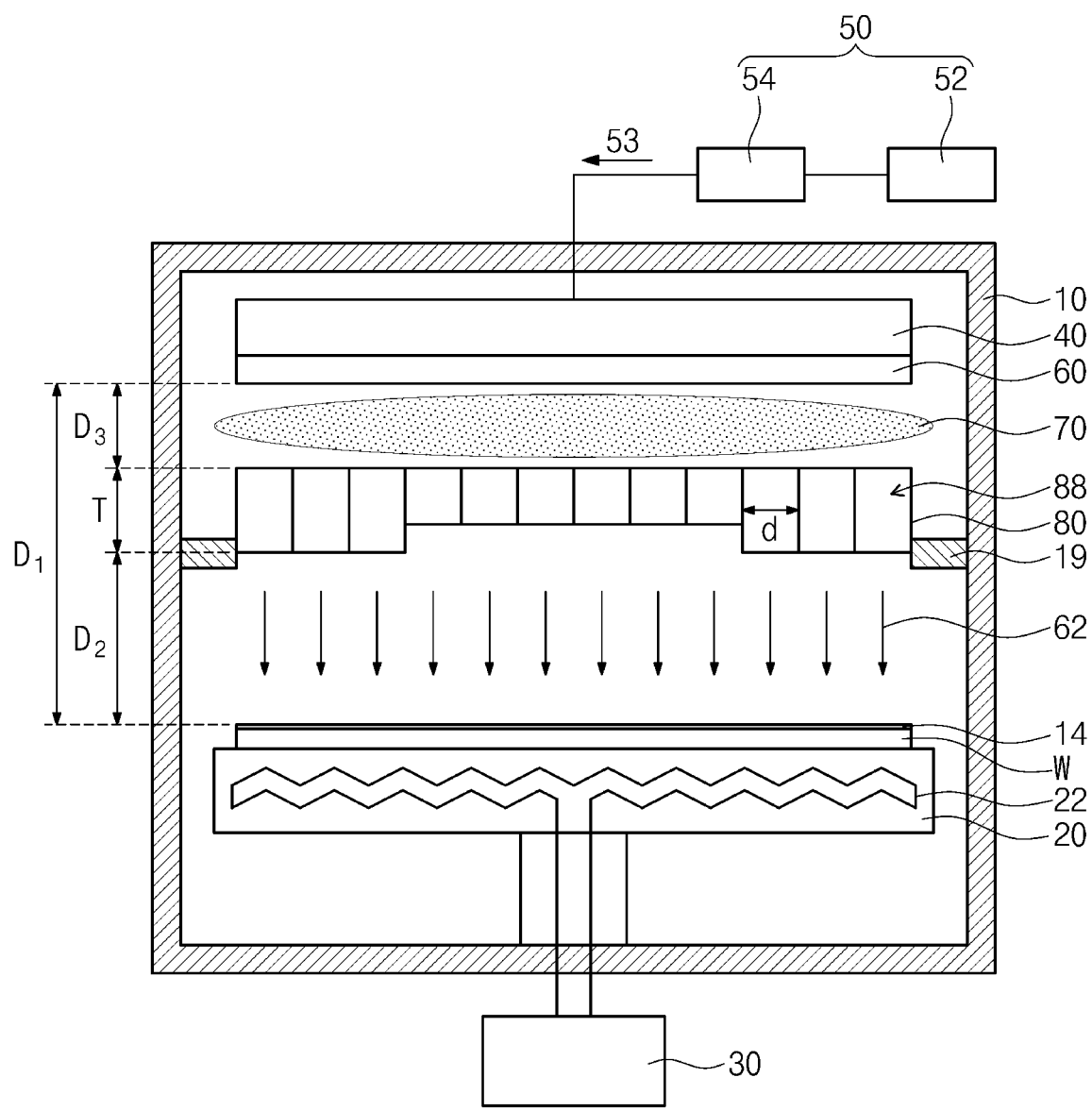
FIG. 1 is a diagram illustrating an apparatus for fabricating a semiconductor device, according to some example embodiments of the inventive concept.

FIG. 1 illustrates an apparatus 100 for fabricating a semiconductor device, according to some example embodiments of the inventive concept.

Referring to FIG. 1, a fabrication apparatus 100 may be used to fabricate a semiconductor device and may be used as a physical vapor deposition (PVD) system or a sputtering system. In some embodiments, the fabrication apparatus 100 may include a chamber 10, a heater chuck 20, a heating power supply part 30, a plasma electrode 40, a radio frequency (RF) power supply part 50, a target 60, and a collimator 80.

The chamber 10 may be configured to allow a substrate W to be placed in an isolated space. The chamber 10 may be configured to have a vacuum pressure of, for example, about 1E–8 Torr to about 1E–4 Torr.

The heater chuck 20 may be placed in a lower region of the chamber 10. The heater chuck 20 may be configured to load the substrate W thereon. The heater chuck 20 may have a heater line 22. The heater line 22 may be used to heat the substrate W.

The heating power supply part 30 may be connected (e.g., electrically connected) to the heater line 22. The heating power supply part 30 may be configured to supply heating power to the heater line 22. The heater line 22 may be configured to heat the substrate W using the heating power. For example, the substrate W may be heated up to about 300° C. or higher by the heater line 22.

The plasma electrode 40 may be placed in an upper region of the chamber 10. The plasma electrode 40 may be used to generate plasma 70 in the chamber 10, when RF power 53 is supplied from the RF power supply part 50.

The RF power supply part 50 may be connected (e.g., electrically connected) to the plasma electrode 40. The RF power supply part 50 may be configured to supply the RF power 53 to the plasma electrode 40. In some embodiments, the RF power supply part 50 may include an RF power generator 52 and a matcher 54. The RF power generator 52 may be configured to generate the RF power 53. The matcher 54 may connect the RF power generator 52 to the plasma electrode 40. The matcher 54 may be configured to allow for impedance matching between the RF power 53 in the chamber 10 and the RF power 53 in the RF power generator 52. The impedance matching of the RF powers 53 may make it possible to maximally increase the efficiency of the RF power 53.

The target 60 may be located between the plasma electrode 40 and the substrate W. The target 60 may be fixedly located on a bottom surface of the plasma electrode 40. The target 60 may contain a source material for depositing a thin layer 14 (e.g., a preliminary phase transition layer 116a in FIG. 13) on the substrate W. For example, the target 60 may be formed of or include a chalcogenide compound whose melting point is 600° C. or higher, and which contains a non-metal element (e.g., Ge) and a metal element (e.g., Sb and Te). If the plasma 70 is generated between the target 60 and the substrate W, source particles 62 may be produced from the target 60. The source particles 62 may be deposited to form the thin layer 14 on the substrate W. An amount of the source particles 62 or a thickness of the thin layer 14 may be in proportion to the plasma 70 or an intensity of the RF power. For example, if plasma 70 or an intensity of the RF power is increased, the thickness of the thin layer 14 or the amount of the source particles 62 is also increased. If plasma 70 or an intensity of the RF power is decreased, the thickness of the thin layer 14 or the amount of the source particles 62 is also decreased.

A thickness of the thin layer 14 on center and edge regions of the substrate W may be dependent on temperature of the substrate W. For example, when the substrate W has a room temperature (e.g., about 25° C.), a thickness of the thin layer 14 may be greater on the center region of the substrate W than on the edge region of the substrate W. This is because, at room temperature, the source particles 62 in the plasma 70 are concentrated on the center region of the substrate W.

On the other hand, when the substrate W is heated to a temperature much higher than the room temperature (e.g., higher than 50% of a melting point of a chalcogenide compound or higher than 300° C.), a thickness of the thin layer 14 may be smaller on the center region of the substrate W than on the edge region of the substrate W. This may result from a spatial variation in temperature of the substrate W between the center and edge regions. In the case where the substrate W is heated to a high temperature (e.g., higher than about 300° C.) by the heater chuck 20, the temperature of the substrate W may be higher at the center region than at the edge region. If the temperature of the substrate W is higher at the center region than at the edge region, there may be a spatial variation (e.g., between the center and edge regions of the substrate W) in sublimation rate of the metal elements (e.g., Sb and Te) to the non-metal element (e.g., Ge) in the thin layer 14. The sublimation rate of the metal element (e.g., Sb and Te) may be higher at the center region of the substrate W than at the edge region. Due to the variation in sublimation rate of the metal elements (e.g., Sb and Te), the thin layer 14 may be formed to be thicker on the edge region of the substrate W than on the center region.

The collimator 80 may be provided between the substrate W and the target 60. The collimator 80 may be fixed to facing slots 19 which are provided on inner sidewalls of the chamber 10. The collimator 80 may be configured to reduce the spatial variation in sublimation rate of the metal elements (e.g., Sb and Te) and thereby to allow the thin layer 14 to be formed to a uniform thickness. In some embodiments, the collimator 80 may include a plurality of holes 88, through which the source particles 62 can pass. The source particles 62 may be deposited on the substrate W through the holes 88. The collimator 80 may increase straightness of trajectories of the source particles 62. For example, in some embodiments, the collimator 80 may facilitate the passing of source particles 62 through the plurality of holes 88 towards the top surface of the substrate W in a direction substantially perpendicular to the top surface of the substrate W so that the thin layer 14 may be formed to a uniform thickness on the entire top surface of the substrate W.

In certain embodiments, the collimator 80 may be configured to allow for adsorption or filtering of some of the source particles 62, and the adsorption or filtering of the source particles 62 may be used to adjust a spatial variation in deposition thickness of the thin layer 14. An amount of the source particles 62 adsorbed or filtered by the collimator 80 may be higher at an edge of the collimator 80 than at a center of the collimator 80. For example, an adsorption or filtering amount of the source particles 62 may be in proportion to a surface area of a side surface of each of the holes 88, which are provided in the collimator 80. Thus, by changing a thickness T, in a direction perpendicular to the top surface of substrate W, of the collimator 80 or a diameter d, in a direction parallel to the top surface of the substrate W, of the holes 88, it may be possible to improve uniformity in deposition thickness of the thin layer 14.

In some embodiments, the thickness T of the collimator 80 may be less than a first distance D1 in a direction perpendicular to the top surface of substrate W between the substrate W and the target 60. For example, in the case where the first distance D1 is between about 55 mm and about 65 mm, preferably, about 60 mm, the thickness T of the collimator 80 may range from about 20 mm to about 40 mm. In the case where a second distance D2 in a direction perpendicular to the top surface of substrate W between the collimator 80 and the substrate W is less than about 10 mm, the thin layer 14 may have defects (e.g., stain or fingerprint)

which result from the holes 88. In the case where a third distance D3 in a direction perpendicular to the top surface of substrate W between the collimator 80 and the target 60 is less than about 10 mm, there may be a difficulty in uniformly generating the plasma 70 and/or the source particles 62. In addition, in the case where the thickness T of the collimator 80 is less than about 20 mm, there may be a difficulty in increasing straightness of trajectories of the source particles 62.

Terms such as "about" may reflect amounts, or sizes, that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Figure 2:
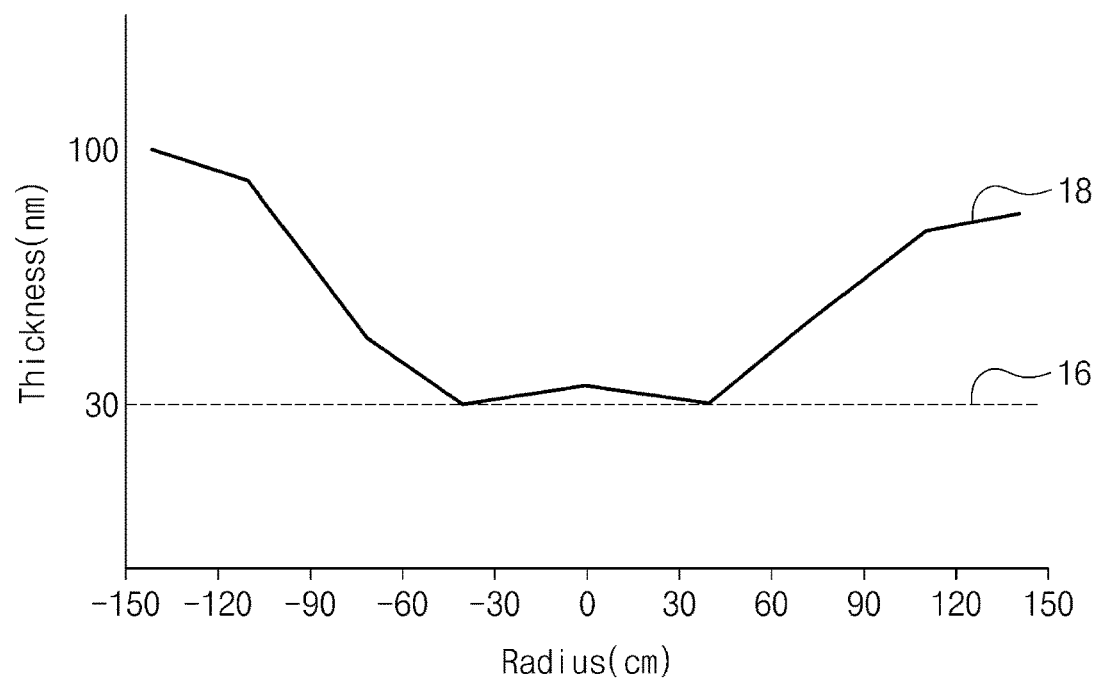
FIG. 2 is a graph showing thickness characteristics of two thin layers, one of which is formed using the collimator of FIG. 1 and the other of which is formed by a conventional method, in which the collimator is not used.

FIG. 2 is a graph showing a thickness profile 16 of a thin layer 14, which is formed using the collimator 80 of FIG. 1, and a thickness profile 18 of a typical thin layer, which is formed without the collimator 80. The substrate W may have a radius of about 150 mm.

Referring to FIG. 2, when the thin layer 14 was formed using the collimator 80, the thickness profile 16 of the thin layer 14 had a small variation, compared with the thickness profile 18 of the typical thin layer. As shown in the thickness profile 16, the thin layer 14 had the same thickness throughout the substrate W (i.e., not only on the center region (0 to ±60 cm) but also on the edge region (±60 cm to ±150)). By contrast, as shown in the thickness profile 18, the typical thin layer was thicker on the edge region (±60 cm to ±150) of the substrate W than on the center region (0 to ±60 cm).

According to exemplary embodiments, each hole 88 includes an inner side surface that may have a cylindrical shape, and includes respective openings at the top and bottom, wherein the inner side surface has a first area, and when viewed from a top-down view perpendicular to the to surface of the collimator 80, each opening of each hole 88 has a second area. The top and bottom openings of each hole 88 may have the same area as each other in some embodiments.

Referring back to FIG. 1, in the case where the holes 88 are formed to have the same diameter d, the collimator 80 may be thinner at the center than at the edge. In this exemplary embodiment, an area ratio (or an area density) of each of the holes 88 at the edge of the collimator 80 may be greater than that of the center of the collimator 80. In the case where a distance between the holes 88 (e.g., G of FIG. 4) is neglected, the area ratio may be given by dividing a surface area of entire inner side surface of each of the holes 88 in the collimator 80 (i.e., $\pi dT$) by a planar area (i.e., the area of the top opening or the bottom opening) of each of the holes 88 (i.e., $\pi(d/2)^2$); i.e., $\pi dT/\pi(d/2)^2 = 4T/d$. For example, the area ratio (i.e., $\pi dT/\pi(d/2)^2$) may be calculated as a surface area of a side surface of each of the holes 88 per an area of a top surface of the collimator 80.

An amount of the source particles 62 adsorbed or filtered by the collimator 80 may be proportional to the area ratio ($\pi dT/\pi(d/2)2$). In the case where the collimator 80 is used, a deposition rate of the source particles 62 to be deposited on the substrate W may be inversely proportional to the area ratio ($\pi dT/\pi(d/2)2$). Thus, if the area ratio ($\pi dT/\pi(d/2)2$) is increased, the deposition rate of the source particles 62 to be deposited on the substrate W is decreased and if the area ratio ($\pi dT/\pi(d/2)2$) is decreased, the deposition rate of the source particles 62 to be deposited on the substrate W is increased. The deposition rate of the source particles 62 may be adjusted to reduce or compensate a spatial variation in sublimation rate of the metal elements (e.g., Sb and Te), which are contained in the thin layer 14. The deposition rate of the source particles 62 on the center region of the substrate W may be higher than the deposition rate of the particles 62 on the edge region of the substrate W. The source particles 62 may be deposited to form a layer that is thinner on the edge region of the substrate W than on the center region of the substrate W. Thus, the collimator 80 may be configured to adjust the deposition rate of the source particles 62 according to a deposition position on the substrate W and thereby to form the thin layer 14 having a uniform thickness.

Figure 3:
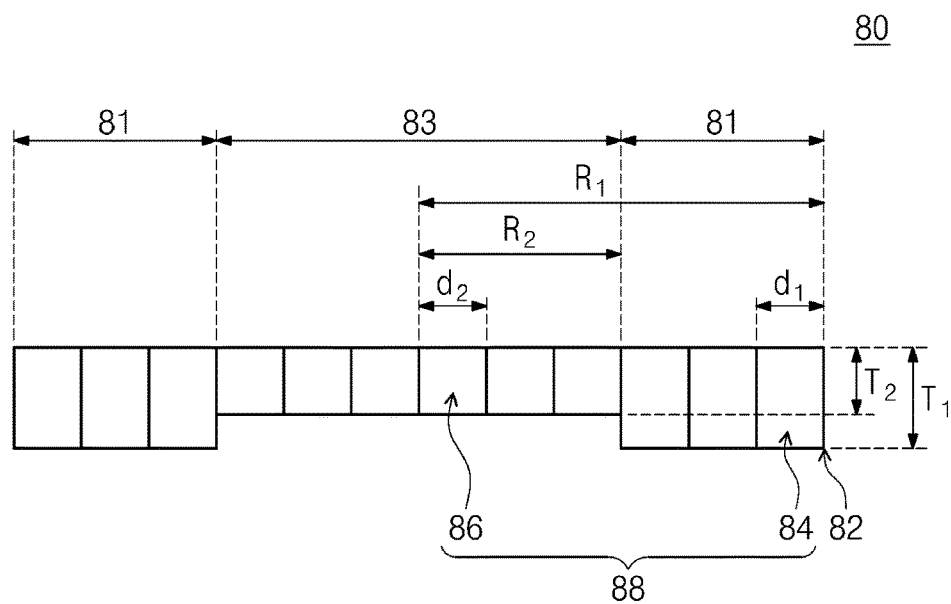
FIG. 3 is a sectional view illustrating an example of the collimator of FIG. 1.
Figure 4:
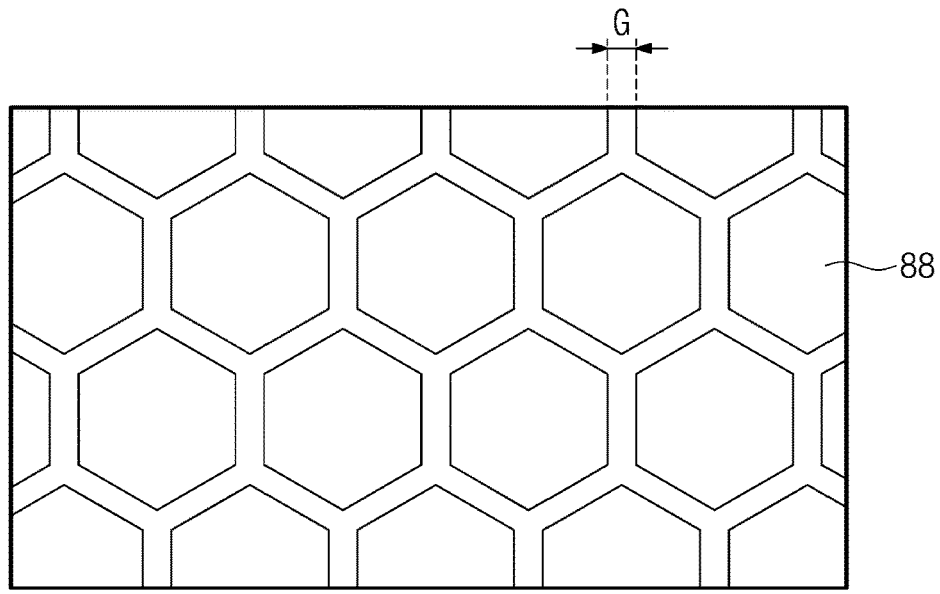
FIG. 4 is a plan view illustrating an example of holes of FIG. 3.

FIG. 3 illustrates an example of the collimator 80 of FIG. 1. FIG. 4 illustrates an example of holes 88 of FIG. 3.

Referring to FIG. 3, the collimator 80 may include a plate 82 and holes 88 in the plate 82.

The plate 82 may include a metallic material different from the chamber 10 of FIG. 1. For example, the plate 82 may include a circular steel plate. The plate 82 may have a first radius $R_1$ of about 150 mm in a direction parallel to the top surface of the substrate W (e.g., which may be about the same radius as the substrate W). The plate 82 may include a plurality of regions having at least two different thicknesses. In some embodiments, the plate 82 may have opposing edge regions 81 and a center region 83. Each of the edge region 81 may be thicker than the center region 83. For example, in the case where the edge region 81 has a first thickness $T_1$ in a direction perpendicular to the top surface of the substrate W, the center region 83 may have a second thickness $T_2$ in the direction perpendicular to the top surface of the substrate W smaller than the first thickness $T_1$. The edge region 81 of the plate 82 may have a first radius $R_1$ of about 150 mm, and the center region 83 may have a second radius $R_2$ of about 80 mm in a direction parallel to the top surface of the substrate W.

Terms such as "same," or "equal," as used herein when referring to sizes, amounts, or other measures do not necessarily mean an exactly identical size, amount, or other measure, but are intended to encompass nearly identical sizes, amounts, or other measures within acceptable variations that may occur, for example, due to manufacturing processes.

Referring to FIGS. 3 and 4, the holes 88 may be formed to penetrate the plate 82 from a top surface to a bottom surface. The holes 88 may have a hexagonal honeycomb shape. However, the disclosure is not limited to the hexagonal honeycomb shape. For example, in alternative embodiments, the holes 88 may have a triangular, rectangular, pentagonal, octagonal, or circular shape. The holes 88 may be densely arranged in the plate 82. The holes 88 may be spaced apart from each other by a constant distance G. The distance G between the holes 88 may be less than, for example, about 1 mm. In some embodiments, the holes 88 may include edge holes 84 and center holes 86.

The edge holes 84 may be formed in the edge region 81 of the plate 82. The edge holes 84 may have a first diameter $d_1$ in a direction parallel to the top surface of the substrate W. In some embodiments, the first diameter $d_1$ may be smaller than the first thickness $T_1$ of the plate 82. For example, the first thickness $T_1$ may be about 1.2 to about 1.4 times the first diameter $d_1$.

The center holes 86 may be formed in the center region 83 of the plate 82. The center holes 86 may have a second diameter $d_2$ in a direction parallel to the top surface of the substrate W. In some embodiments, the second diameter $d_2$ may be equal to the second thickness $T_2$. For example, each of the second diameter $d_2$ and the second thickness $T_2$ may be about 25 mm.

When the first diameter $d_1$ is equal to the second diameter $d_2$, an area ratio of each of the edge holes 84 (i.e., $\pi d_1 T_1/\pi(d_1/2)^2 = 4T_1/d_1$) may be equal to $T_1/T_2$ times an area ratio of each of the center holes 86 (i.e., $\pi d_2 T_2/\pi(d_2/2)^2 = 4T_2/d_2$).

In the collimator 80 according to some embodiments of the inventive concept, a ratio in area ratio between each of the edge holes 84 in the edge region 81 and each of the center holes 86 in the center region 83 may be adjusted to allow the thin layer 14 to be formed to a uniform thickness.

Figure 5:
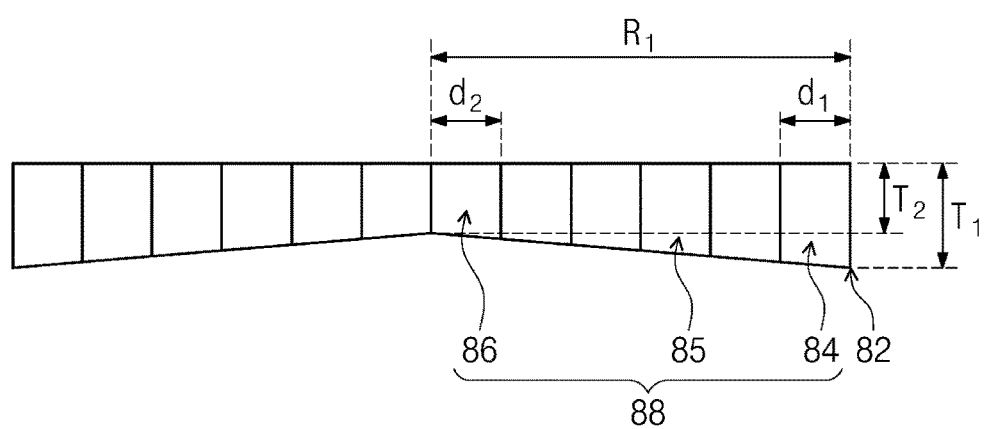
FIG. 5 is a sectional view illustrating an example of the collimator of FIG. 1.

FIG. 5 illustrates an example of the collimator 80 of FIG. 1.

Referring to FIG. 5, the plate 82 of the collimator 80 may have a gradually increasing thickness in a direction from the center to the edge. For example, in the case where the plate 82 has a flat top surface, the plate 82 may have a concave bottom surface. In the case where the edge and center regions of the plate 82 have the first and second thicknesses $T_1$ and $T_2$, the bottom surface of the plate 82 may have an inclined or rounded shape in a direction from the edge to the center. In the case where the first diameter $d_1$ of the edge holes 84 is equal to the second diameter $d_2$ of the center holes 86, the area ratio (i.e., $4T_1/d_1$) of each of the edge holes 84 may be $T_1/T_2$ times the area ratio (i.e., $4T_2/d_2$) of each of the center holes 86. For example, in the case where the first thickness $T_1$ of the edge region is about 30 nm and the second thickness $T_2$ of the center region is about 25 nm and in the case where the first diameter $d_1$ of the edge holes 84 is equal to the second diameter $d_2$ of the center holes 86, the area ratio (i.e., $4T_1/d_1$) of each of the edge holes 84 may be 1.2 times the area ratio (i.e., $4T_2/d_2$) of each of the center holes 86. According to another exemplary embodiment, in the case where the first thickness $T_1$ of the edge region is about 35 nm and the second thickness $T_2$ of the center region is about 25 nm and in the case where the first diameter $d_1$ of the edge holes 84 is equal to the second diameter $d_2$ of the center holes 86, the area ratio (i.e., $4T_1/d_1$) of each of the edge holes 84 may be 1.4 times the area ratio (i.e., $4T_2/d_2$) of each of the center holes 86. An area ratio of each of intermediate holes 85, which are located between the center holes 86 and the edge holes 84, may be larger than the area ratio (i.e., $4T_2/d_2$) of each of the center holes 86 and may be smaller than the area ratio (i.e., $4T_1/d_1$) of each of the edge holes 84.

Figure 6:
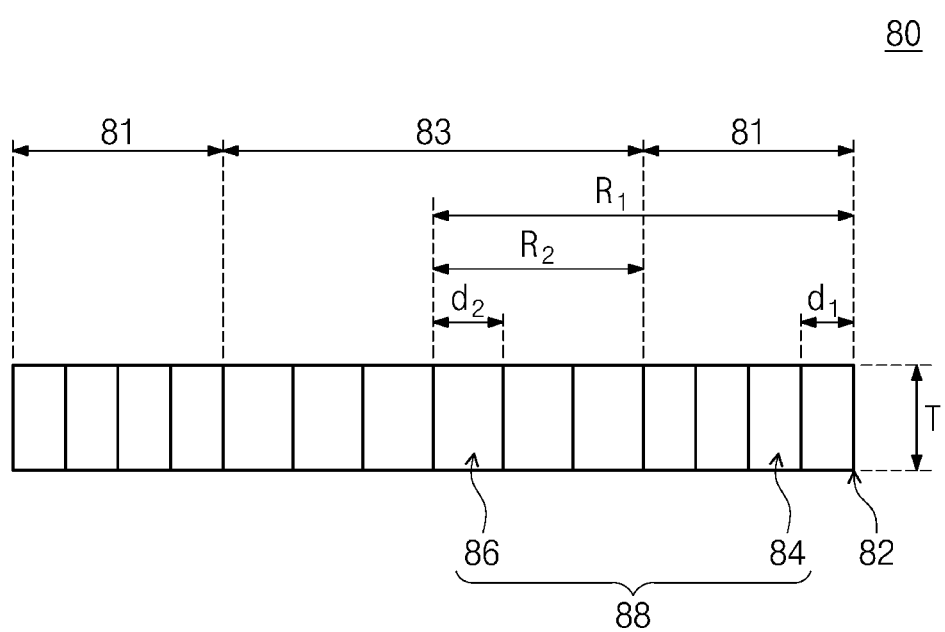
FIG. 6 is a sectional view illustrating an example of the collimator of FIG. 1.

FIG. 6 illustrates an example of the collimator 80 of FIG. 1.

Referring to FIG. 6, the plate 82 of the collimator 80 may have a constant thickness T, and the holes 88 may have a decreasing diameter in a direction from the center of the plate 82 toward the edge. For example, the first diameter $d_1$ of the edge holes 84 may be smaller than the second diameter $d_2$ of the center holes 86. The number per unit area of the edge holes 84 may be greater than that of the center holes 86. An area ratio of each of the edge holes 84 (i.e., $\pi d_1 T/\pi(d_1/2)^2 = 4T/d_1$) may be $d_2/d_1$ times an area ratio of each of the center holes 86 (i.e., $\pi d_2 T/\pi(d_2/2)^2 = 4T/d_2$).

The afore-described fabrication apparatus 100 may be used to fabricate a semiconductor device, as will be described in more detail below.

Figure 7:
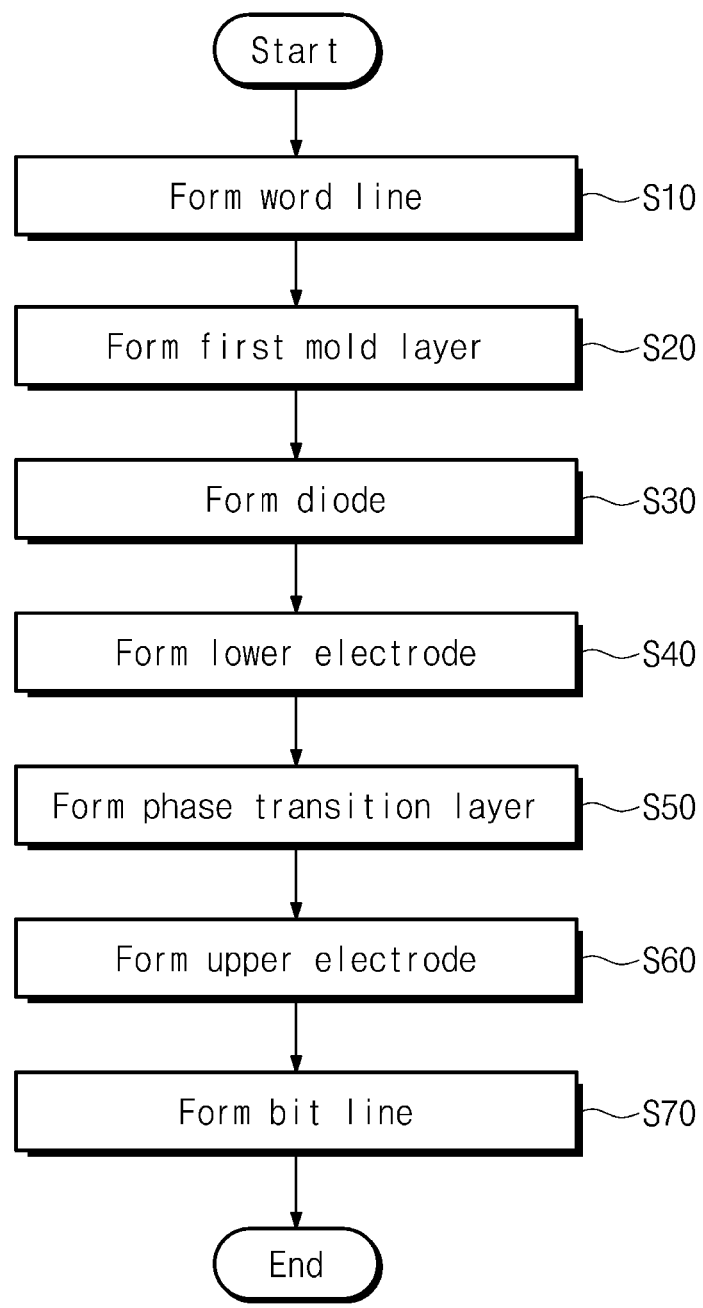
FIG. 7 is a flow chart illustrating a method of fabricating a semiconductor device, according to some example embodiments of the inventive concept.

FIG. 7 is a flow chart illustrating a method of fabricating a semiconductor device, according to some example embodiments of the inventive concept. FIGS. 8 to 16 are sectional views illustrating process steps in the fabricating method of FIG. 7.

Referring to FIG. 7, the fabricating method may be used to fabricate a phase-transition memory device. In some embodiments, the method of fabricating a semiconductor device may include forming a word line (in S10), forming a first mold layer (in S20), forming a diode (in S30), forming a lower electrode (in S40), forming a phase transition layer (in S50), forming an upper electrode (in S60), and forming a bit line (in S70).

Figure 8:
FIGS. 8 to 16 are sectional views illustrating process steps of a process of fabricating a semiconductor device.

Referring to FIGS. 7 and 8, a word line 102 may be formed on the substrate W (in S10). The substrate W may include a silicon wafer. The word line 102 may include a conductive layer (e.g., doped silicon layer or a metal layer). The word line 102 may be formed by an ion implantation process of injecting dopants into the substrate W. In certain embodiments, the word line 102 may be formed by depositing a conductive layer (e.g., using PVD or CVD), performing a photolithography process, and performing an etching process. The word line 102 may be formed on the substrate W to extend in a first direction (not shown).

Figure 9:
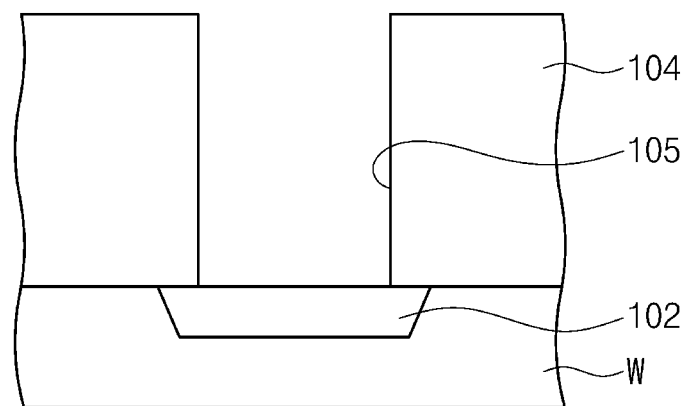

Referring to FIGS. 7 and 9, a first mold layer 104 may be formed on a portion of the word line 102 and the substrate W (in S20). The first mold layer 104 may be formed of or include at least one of dielectric materials (e.g., silicon oxide, silicon nitride, or silicon oxynitride). The first mold layer 104 may be a dielectric layer that is formed by a deposition process (e.g., CVD). The first mold layer 104 may have a first contact hole 105. The first contact hole 105 may be formed to expose a portion of the word line 102 to the outside. The first contact hole 105 may be formed by performing a photolithography process and performing an etching process on the first mold layer 104.

Figure 10:
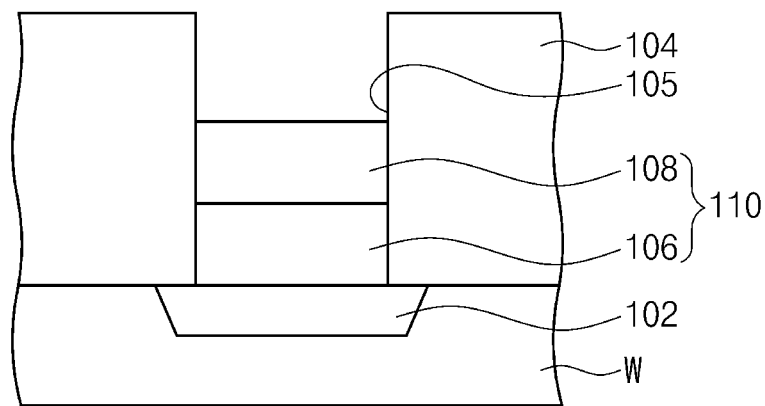

Referring to FIGS. 7 and 10, a diode 110 may be formed in the first contact hole 105 of the first mold layer 104 (in S30). The diode 110 may be formed to fill a lower region of the first contact hole 105. For example, the diode 110 may be formed by depositing a poly silicon layer and performing an ion implantation process of injecting impurities (e.g., boron or arsenic) into the poly silicon layer. The diode 110 may include a first doped region 106 and a second doped region 108. The first doped region 106 may be formed on the word line 102 in the first contact hole 105. The second doped region 108 may be formed on the first doped region 106. The first doped region 106 may be formed to contain dopants different from those in the second doped region 108. For example, in the case where boron atoms are used as dopants in the first doped region 106, arsenic atoms may be used as dopants in the second doped region 108.

Figure 11:
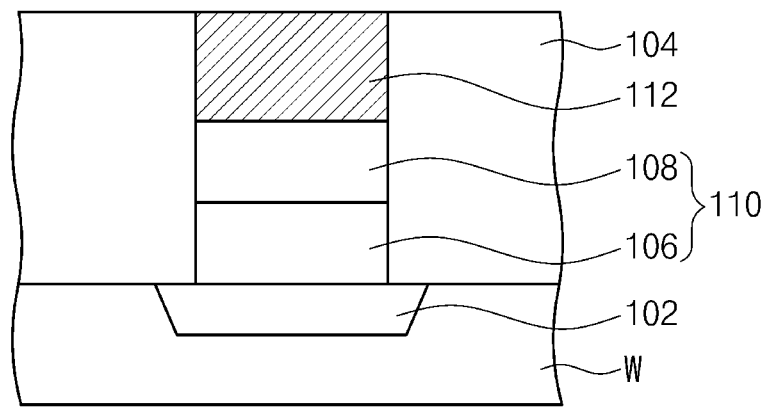

Referring to FIGS. 7 and 11, a lower electrode 112 may be formed on the diode 110 (in S40). The lower electrode 112 may be formed in an upper region of the first contact hole 105. The lower electrode 112 may be formed by a damascene process. For example, the lower electrode 112 may be formed by depositing a metal or metal silicide layer and polishing the metal or metal silicide layer.

Referring to FIG. 7 and FIGS. 12 to 14, a phase transition layer 116 may be formed on the lower electrode 112 (in S50). The phase transition layer 116 may be formed by a damascene process.

Figure 17:
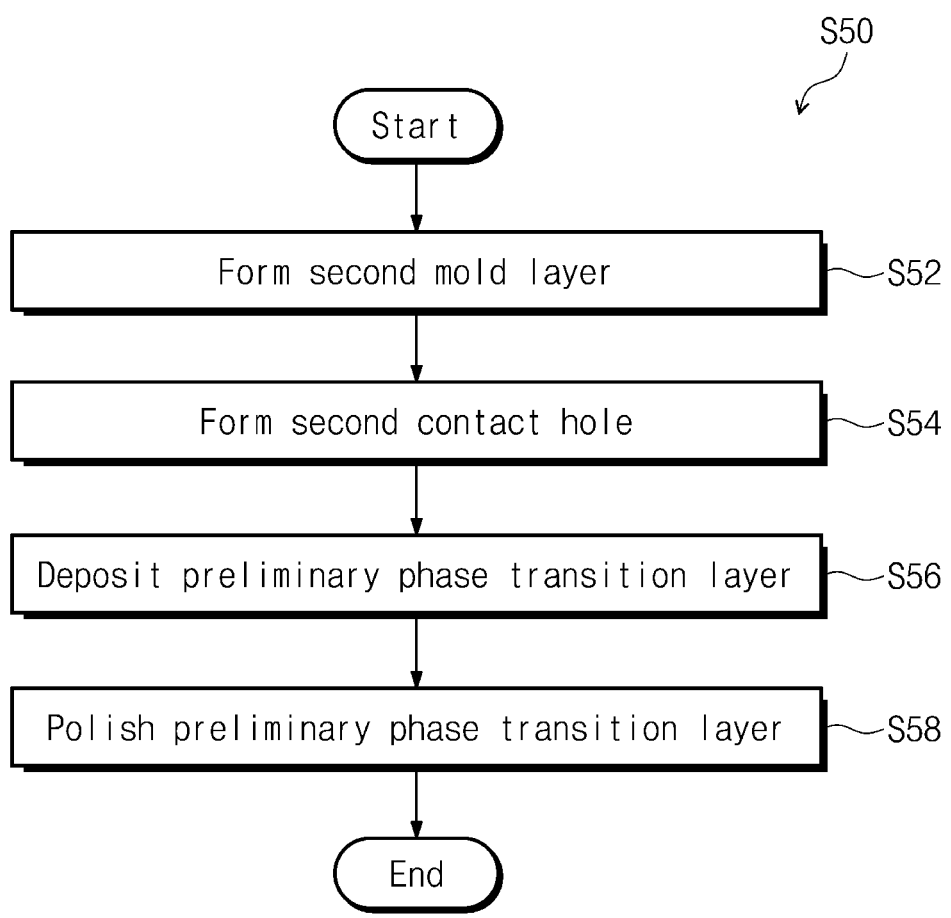
FIG. 17 is a flow chart illustrating an example of forming a phase transition layer (e.g., in FIG. 7).

FIG. 17 is a flow chart illustrating an example of forming the phase transition layer 116 (e.g., in S50 of FIG. 7).

Referring to FIG. 17, the formation of the phase transition layer 116 (in S50) may include forming a second mold layer (in S52), forming a second contact hole in the second mold layer (in S54), depositing a preliminary phase transition layer (in S56), and polishing the preliminary phase transition layer (in S58).

Figure 12:
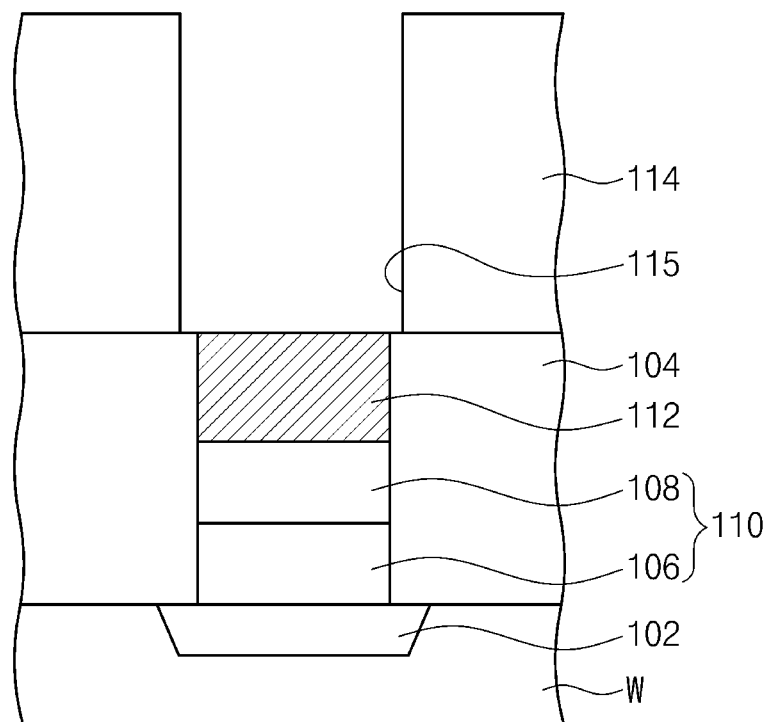

Referring to FIGS. 12 and 17, a second mold layer 114 may be formed on the lower electrode 112 and the first mold layer 104 (in S52). The second mold layer 114 may be formed of or include at least one of dielectric materials (e.g., silicon oxide, silicon nitride, or silicon oxynitride). The second mold layer 114 may be a dielectric layer that is formed by a deposition process (e.g., CVD).

Figure 13:
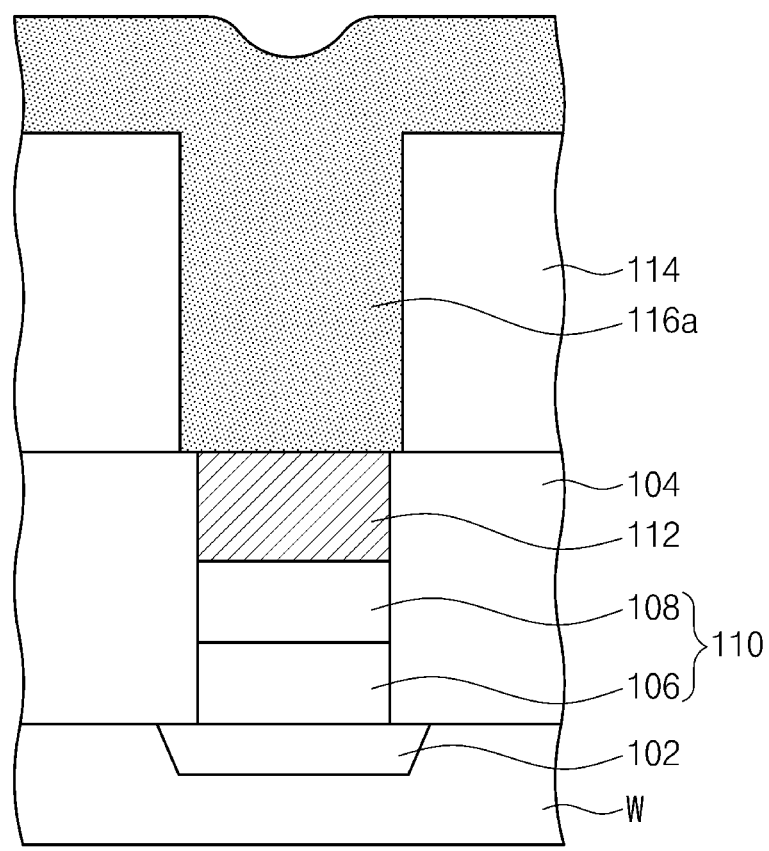

Referring to FIGS. 13 and 17, a portion of the second mold layer 114 on the lower electrode 112 may be etched to form a second contact hole 115 (in S54). The second contact hole 115 may be formed by performing a photolithography process and then performing an etching process on the second mold layer 114.

Referring to FIGS. 1, 3 to 6, 14, and 17, a preliminary phase transition layer 116a may be deposited on the lower electrode 112 and the second mold layer 114 using the fabrication apparatus 100 to fill the second contact hole 115 (in S56). The preliminary phase transition layer 116a may be formed of or include at least one of chalcogenide compounds (e.g., including Ge, Sb, and Te). For example, the preliminary phase transition layer 116a may be formed by a physical vapor deposition method (e.g., a sputtering method) using the collimator 80. In some embodiments, the collimator 80 may be provided to have the plate 82 and the holes 88, and here, the holes 88 may be provided to have an area ratio that increases in a direction from a center of the plate 82 toward an edge. Thus, the preliminary phase transition layer 116a may be formed to have a uniform thickness.

Figure 18:
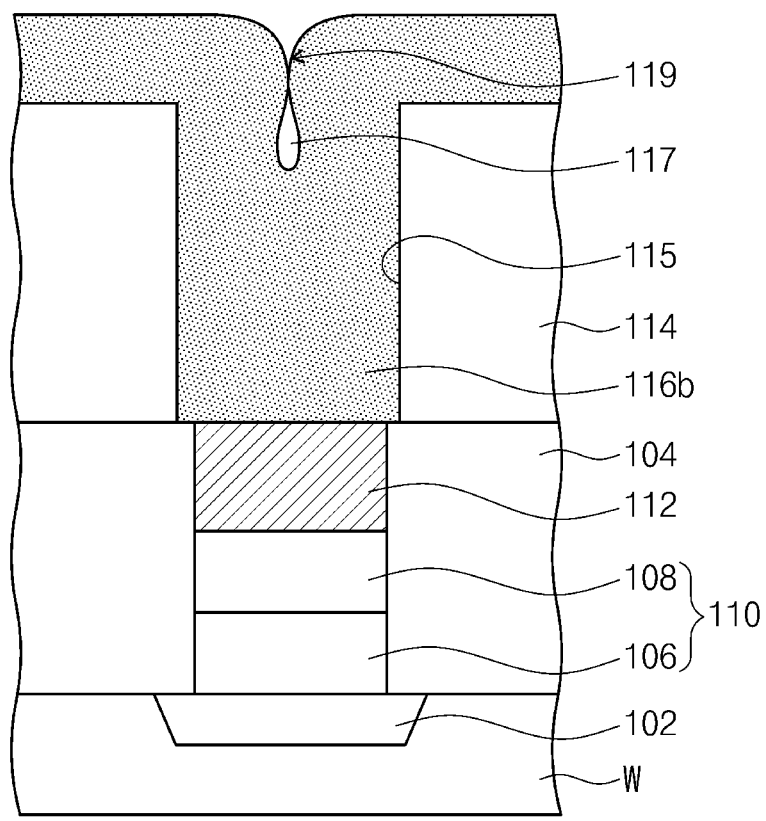
FIG. 18 illustrates a void defect, which is formed in a preliminary phase transition layer, when the preliminary phase transition layer is formed using a conventional method, in which the collimator of FIG. 1 is not used.

FIG. 18 illustrates a void defect 117, which is formed in a preliminary phase transition layer 116b, when the preliminary phase transition layer 116b is formed using a conventional method, in which the collimator 80 of FIG. 1 is not used.

Referring to FIG. 18, a typical preliminary phase transition layer 116b may have a void defect 117 formed by an overhang 119 on the second contact hole 115. In the case where a trajectory of the source particle 62 of FIG. 1 has a small straightness, the overhang 119 and the void defect 117 may be formed in the second contact hole 115. Furthermore, in the case where the typical preliminary phase transition layer 116b is formed at a high deposition rate, the overhang 119 and the void defect 117 may be respectively formed above and in the second contact hole 115. In the case where a deposition rate of the source particles 62 of FIG. 1 is increased, the overhang 119 and the void defect 117 may be formed in the typical preliminary phase transition layer 116b.

Referring to FIGS. 1 to 6 and 13, the collimator 80 may allow the source particle 62 to travel along a trajectory with a large straightness (e.g., in a direction substantially perpendicular to the top surface of the substrate W), and thus, it may be possible to form the preliminary phase transition layer 116a in the second contact hole 115 without formation of the overhang 119 and the void defect 117.

Furthermore, the collimator 80 may be configured to compensate or reduce a positional difference in sublimation rate of metallic elements (e.g., Sb and Te), which are contained in the preliminary phase transition layer 116a, and thereby to allow the preliminary phase transition layer 116a to have a uniform thickness on the center and edge regions of the substrate W. In certain embodiments, the collimator 80 may be configured to reduce a deposition rate of the source particles 62 and thereby to prevent the overhang 119 or the void defect 117 from being formed in the preliminary phase transition layer 116a. An amount of the source particles 62, which are adsorbed in or filtered by the holes 88, may be proportional to an area ratio of each of the holes 88 of the collimator 80.

Figure 14:
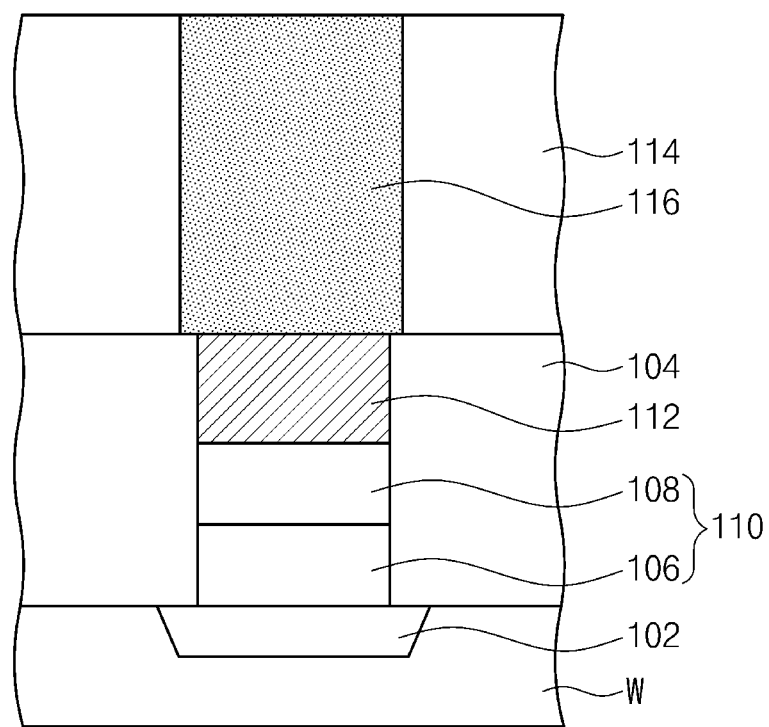

Referring to FIGS. 14 and 17, the preliminary phase transition layer 116a may be polished to form the phase transition layer 116 in the second contact hole 115 (in S58). The preliminary phase transition layer 116a may be polished by a chemical mechanical polishing (CMP) method. The preliminary phase transition layer 116a may be polished to expose the top surface of the substrate W.

Figure 15:
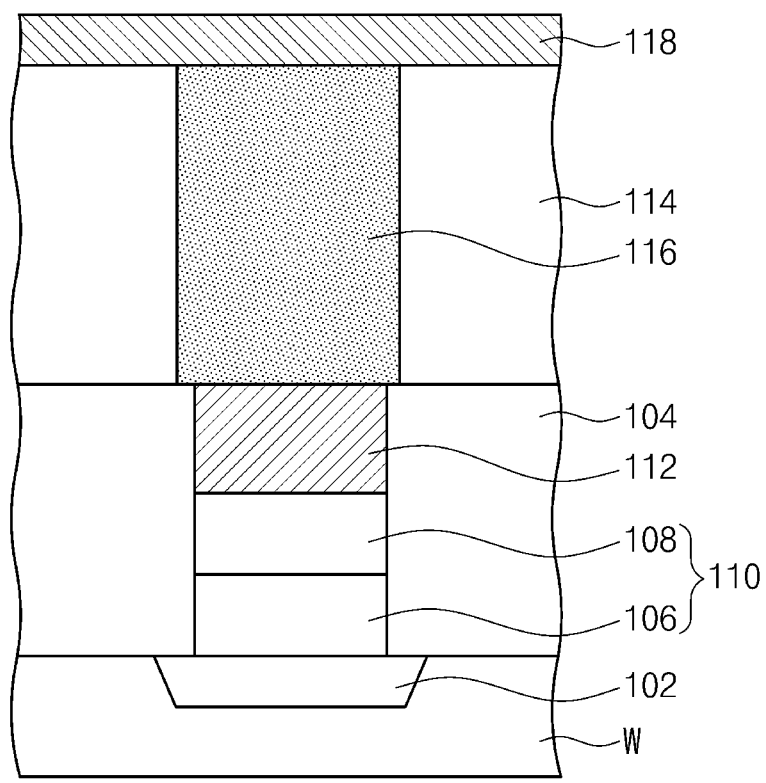

Referring to FIGS. 7 and 15, an upper electrode 118 may be formed on the phase transition layer 116 and the second mold layer 114 (in S60). The upper electrode 118 may be formed by depositing a metal layer (e.g., using PVD or CVD), performing a photolithography process, and performing an etching process.

Figure 16:
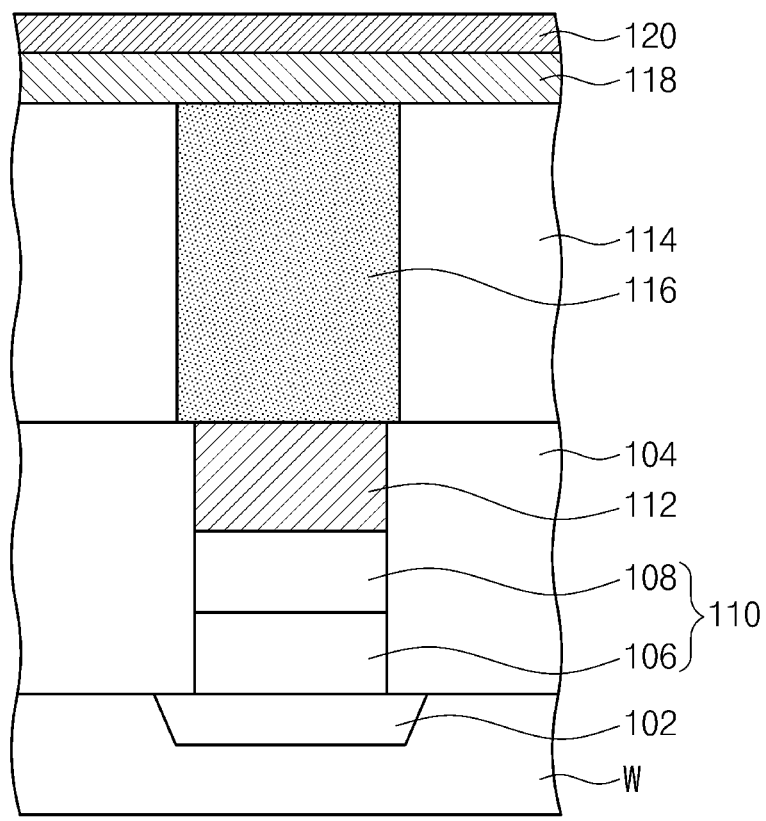

Referring to FIGS. 7 and 16, a bit line 120 may be formed on the upper electrode 118 (in S70). The bit line 120 may be formed by depositing a metal layer (e.g., using PVD or CVD), performing a photolithography process, and performing an etching process. The bit line 120 may be formed to extend in a second direction different from the first direction of the word line 102.

The fabricating method according to some embodiments of the inventive concept may be used not only for the afore-described process for forming the phase transition layer 116 but also for other general sputtering processes.

According to some embodiments of the inventive concept, a semiconductor device may be fabricated using an apparatus including a collimator. The collimator may include a plurality of holes, which are formed to have an area ratio increasing in a direction from a center of a plate toward an edge. In the case where the collimator is used to form a thin layer on a substrate, it may be possible to reduce a difference in sublimation rate of metallic elements between center and edge regions of the substrate and to increase the thickness uniformity of the thin layer.

While example embodiments of the inventive concepts have been particularly shown and described, it will be understood by one of ordinary skill in the art that variations in form and detail may be made therein without departing from the spirit and scope of the attached claims.

What is claimed is:

1. An apparatus for fabricating a semiconductor device, comprising:
   a chamber;
   a heater chuck provided in a lower region of the chamber;
   a plasma electrode provided in an upper region of the chamber, wherein the plasma electrode is coupled to a target which contains a source material for a thin layer to be deposited on a substrate on the heater chuck; and
   a collimator provided between the heater chuck and the target,
   wherein the collimator comprises a plate having a plurality of holes,
   wherein the plurality of holes comprise:
   first holes disposed in a center region of the collimator and having a first aspect ratio; and
   second holes disposed in an edge region of the collimator and having a second aspect ratio,
   wherein the second aspect ratio is larger than the first aspect ratio,
   wherein the first holes have a first diameter, and
   wherein the second holes have a second diameter smaller than the first diameter.

2. The apparatus of claim 1,
wherein the second aspect ratio is 1.2 to 1.4 times larger than the first aspect ratio.

3. The apparatus of claim 2,
wherein the center region of the collimator has a radius of about 80 mm and the edge region of the collimator has a radius from about 80 mm to about 150 mm.

4. The apparatus of claim 2,
wherein, an edge and center of the plate have a same vertical thickness perpendicular to a top surface of the heater chuck, and diameters of the holes decrease in an outward direction parallel to the top surface of the heater chuck from a center of the plate toward an edge of the plate.

5. The apparatus of claim 1,
wherein, a distance between the target and a substrate is between about 55 mm and about 65 mm, and the plate has a thickness ranging from about 20 mm to about 40 mm.

6. The apparatus of claim 1,
wherein the plurality of holes are formed to have a hexagonal honeycomb shape.

7. The apparatus of claim 1,
wherein an aspect ratio of each of the plurality of holes is defined as a ratio of a thickness of the plate to a diameter of each of the holes, or defined as a ratio of a first area of an inner side surface of each of the holes to a second area of a top opening of each of the plurality of holes.

8. The apparatus of claim 1,
wherein the edge region has a first thickness in a direction perpendicular to a top surface of the heater chuck larger than a first diameter of the second holes, and
the center region has a second thickness in the direction perpendicular to the top surface of the heater chuck that is equal to a second diameter of the first holes.

9. The apparatus of claim 8,
wherein the first thickness is about 1.2 to about 1.4 times the first diameter.

10. The apparatus of claim 1,
wherein the collimator is positioned such that a distance between the collimator and substrate is greater than 10 mm, and a distance between the collimator and the target is greater than 10 mm.

* * * * *